(12) United States Patent
Lee et al.

(10) Patent No.: US 6,907,841 B2
(45) Date of Patent: Jun. 21, 2005

(54) APPARATUS AND METHOD FOR SYNTHESIZING SPHERICAL DIAMOND POWDER BY USING CHEMICAL VAPOR DEPOSITION METHOD

(75) Inventors: Jae-Kap Lee, Seoul (KR); Young-Joon Baik, Seoul (KR); Kwang yong Eun, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 113 days.

(21) Appl. No.: 10/330,932

(22) Filed: Dec. 27, 2002

(65) Prior Publication Data

US 2004/0123801 A1 Jul. 1, 2004

(51) Int. Cl.[7] .......................... C23C 16/00; C23C 16/27; C23C 16/503
(52) U.S. Cl. ............... 118/723 E; 118/715; 118/723 R; 118/723 MP; 118/724; 118/725; 118/728
(58) Field of Search ................................. 118/715, 722, 118/723 R, 723 MP, 723 MW, 723 ME, 723 AN, 723 HC, 723 DC, 723 E, 723 ER, 723 I, 723 IR, 724–725, 728

(56) References Cited

U.S. PATENT DOCUMENTS

| | | | | |
|---|---|---|---|---|
| 5,965,034 A | * | 10/1999 | Vinogradov et al. | 216/68 |
| 6,015,597 A | * | 1/2000 | David | 427/577 |
| 6,127,275 A | * | 10/2000 | Flamm | 438/710 |
| 6,143,144 A | * | 11/2000 | Golovato et al. | 204/192.33 |
| 6,197,120 B1 | * | 3/2001 | David | 118/716 |
| 6,231,776 B1 | * | 5/2001 | Flamm | 216/68 |
| 6,443,092 B1 | * | 9/2002 | Lee et al. | 118/723 E |
| 6,508,911 B1 | * | 1/2003 | Han et al. | 118/723 I |
| 6,533,910 B2 | * | 3/2003 | O'Donnell et al. | 204/298.31 |
| 6,554,954 B2 | * | 4/2003 | Ma et al. | 156/345.51 |
| 6,613,442 B2 | * | 9/2003 | O'Donnell et al. | 428/469 |
| 6,713,968 B2 | * | 3/2004 | Ishii et al. | 315/111.21 |
| 6,716,287 B1 | * | 4/2004 | Santiago et al. | 118/729 |
| 6,773,751 B2 | * | 8/2004 | O'Donnell et al. | 427/255.38 |
| 2003/0013315 A1 | * | 1/2003 | Park et al. | 438/710 |
| 2003/0029565 A1 | * | 2/2003 | Suzuki et al. | 156/345.3 |
| 2004/0025788 A1 | * | 2/2004 | Ogasawara et al. | 118/715 |
| 2004/0072426 A1 | * | 4/2004 | Jung | 438/689 |
| 2004/0123801 A1 | * | 7/2004 | Lee et al. | 118/722 |

FOREIGN PATENT DOCUMENTS

JP 07-144996 * 6/1995

* cited by examiner

*Primary Examiner*—Jeffrie R. Lund
(74) *Attorney, Agent, or Firm*—Scully, Scott, Murphy & Presser

(57) ABSTRACT

Disclosed are an apparatus and a method to synthesize powders typed diamond with the size between several tens nm to several $\mu$m in diameter using conventional CVD processes for deposition of diamond films. Gas phase nucleation has been induced on the boundary of plasmas, and as a result the spherical diamond powders accumulated have been obtained on circumferences of the normal substrate. With a modification of a substrate structure, a large area accumulation of the diamond powders of around 100 mm in diameter has been accomplished.

6 Claims, 4 Drawing Sheets

1

APPARATUS AND METHOD FOR SYNTHESIZING SPHERICAL DIAMOND POWDER BY USING CHEMICAL VAPOR DEPOSITION METHOD

BACKGROUND OF THE INVENTION

1. Field of the Invention

Present invention relates to a CVD (chemical vapor deposition) method for synthesizing diamond. A typical type of the CVD diamond is film. Here, we provide an apparatus and a method to synthesize powders typed diamond (several tens nm-several $\mu$m) with conventional CVD processes for deposition of diamond films. Gas phase nucleation has been induced on the boundary of the plasma generated normal CVD apparatus used for deposition of diamond films, and as a result the spherical diamond powders accumulated have been obtained on circumferences of the normal substrate.

2. Description of the Prior Art

Since diamond has the highest hardness among existing materials, diamond powder has been used as abrasive material added to polishing oil in order to improve an abrasive speed, in grinding an oxide group material and very hard material. A particle size of diamond powder used as abrasive material is in the range of several nm~several tens $\mu$m. The particle size has a great influence on a surface roughness of ground material (abrasion object). In case of a lapping process regarded as rough abrasion having a surface unevenness as several tens $\mu$m, diamond powder having a size as several~several tens $\mu$m is used. In case of abrasion for a hard surface having a surface unevenness as several tens nm, diamond powder having a size less than several $\mu$m is used.

In the conventional art, diamond powder as abrasive material is synthesized by breaking diamond having a size as several tens~several hundreds $\mu$m, produced by i) an explosive method (diamond synthesis method using mixing gunpowder with solid graphite in a sealed container and exploding the mixture), or ii) a diamond powder synthesis method by a high pressure and high temperature (HPHT) method (diamond synthesis method using solid graphite as raw material and metal as catalyst at 1500° C. under 50,000 atmospheric pressure). However, diamond powder produced by the explosive method and the HPHT method has an irregular particle shape. It is not appropriate for grinding a hard surface so as to make it have a surface roughness less than several nm to use such diamond powder having an irregular particle shape as abrasive material, because the abrasion object may be scratched.

As a result, oxide group powder or metal powder is used at the end stage of polishing, instead of diamond powder. However, in this case, an additional abrasion process is added, and an abrasion speed lowers.

In order to solve these problems, inventors of the present invention synthesize spherical diamond powders accumulated by inducing gas phase nucleation in the CVD method).

SUMMARY OF THE INVENTION

It is an object of the present invention to provide a method for synthesizing diamond powder having a particle size less than several $\mu$m and having a (spherical) shape by using a CVD (chemical vapor deposition) diamond synthesizing method. In addition, it is another object of the present invention to provide an apparatus for synthesizing diamond powder in great quantities by varying a structure thereof.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

In the present invention, diamond powders with in the size between several tens nm to several $\mu$m in diameter are synthesized by the CVD method. The diamond powders are clearly different from those synthesized by the high pressure and high temperature (HPHT) or the explosion techniques, in that they are spherical and contain a lot of non-diamond phases. Gas phase nucleation, that is, homogeneous nucleation have been induced on boundary zones of the plasma generated by the conventional plasma assisted CVD (PACVD) apparatus, and as a result the spherical diamond powders accumulated have been obtained on circumferences of a substrate where plasma is not in contact. By modifying a substrate structure in the PACVD apparatus, a large area deposition of the diamond powders up to around 100 mm in diameter has been accomplished. The diamond powders obtained by the present invention may be usable for high-grade abrasives and cold cathode emitters. They may be also used in new fields including drug delivery system (DDS), which need their unique natures with extreme stability.

The conditions for the diamond powder synthesis of the present invention, such as gas pressure, carbon sources, gas composition, flow rate, etc., may be identical with those for the conventional diamond film synthesis using CVD method, except that the temperature of the substrate II is below about 477° C., which is relatively low compared with the conventional diamond film synthesis temperature of 650~900° C. Materials generally used in the conventional diamond film synthesis, such as Cu, Si, W, Mo, etc., may be used for the substrates of the present invention. Considering the relatively low temperature of substrate, copper having an excellent thermal conductivity may be more preferable as substrates.

Hereinafter, the present invention will be described in detail with reference to accompanying drawings.

Figure 1:
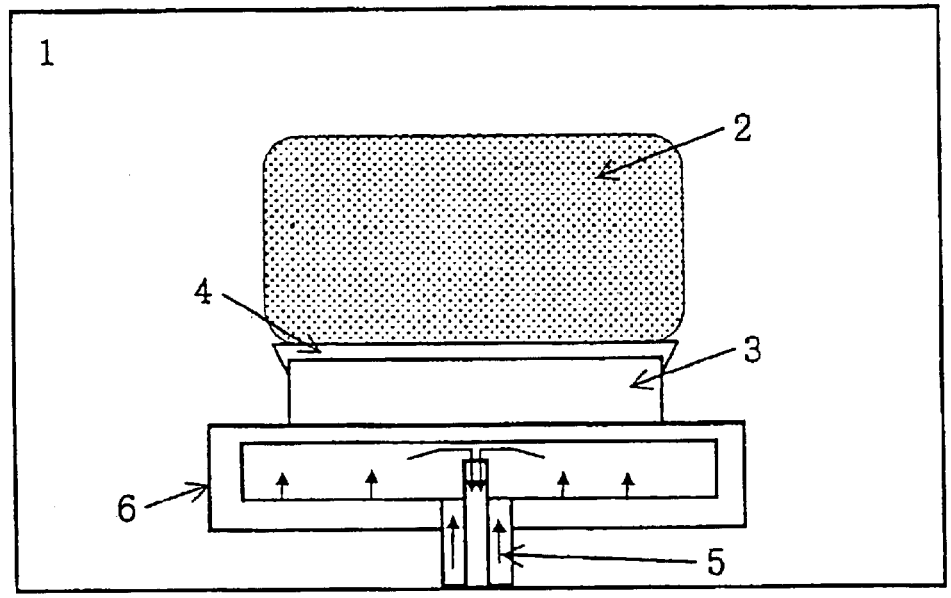
FIG. 1 illustrates a conventional apparatus for synthesizing a diamond film by using a CVD (chemical vapor deposition) method.

FIG. 1 illustrates an example of a conventional CVD apparatus for synthesizing diamond films. In a vacuum container (1), a diamond film (4) is coated on a substrate I (3) in contact with a plasma (2). The substrate I (3) is placed on anode (6) cooled by a coolant (5) circulating. In diamond film deposition, temperatures of the substrate, that is, deposition temperatures are kept between 650–1000° C.

Figure 2:
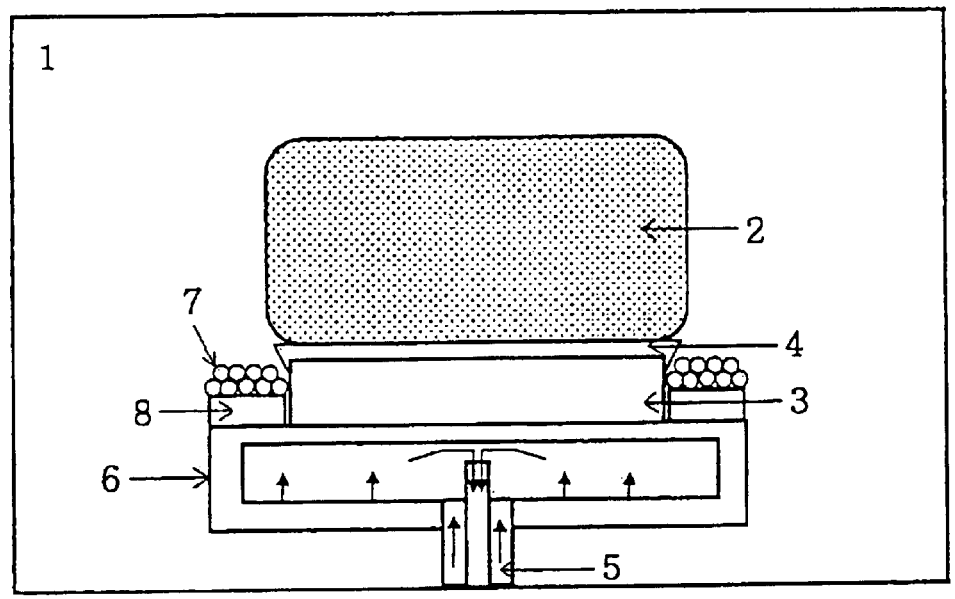
FIG. 2 illustrates an apparatus for synthesizing (spherical) diamond powder in accordance with the present invention and a position therein at which spherical diamond is synthesized.

FIG. 2 illustrates an apparatus for synthesizing spherical diamond powders, in which a second ring-typed substrate II (8) is placed surrounding the first substrate I (3) contacting the plasma as in FIG. 1. In the apparatus, the substrate II (8) is not in contact with the plasma 2 and its temperature is normally maintained below about 477° C., preferably 420–477° C. Herein, gas phase nucleation occurs on the boundary of the plasma, that is, in the gas phase above the ring-typed substrate II (8). Because temperatures in the gas phases can be maintained between 923 and 1173 K where the diamond films are normally deposited. As a result, diamond particles are nucleated and grow in the gas phase and drop onto the second substrate II (8). Finally, we can obtain the diamond powders 7 on the second substrate II (8). The gas phase nucleation must be due to an effective keeping of the temperature of the substrate II (8) below about 477° C. where the plasma is not in contact.

Figure 3:
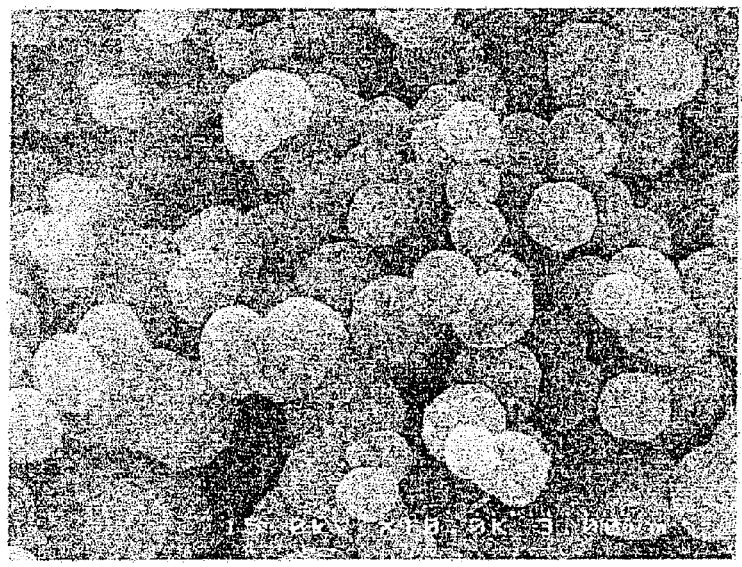
FIG. 3 is a microphotograph showing diamond powder synthesized at the position of the apparatus as shown in FIG. 2.

FIG. 3 illustrates diamond powders obtained on the substrate II in FIG. 2. Each particle is spherical in size between 0.5 and 3 μm in diameter and is accumulated. The powders were confirmed to be diamond by Raman, XRD and TEM analysis Accordingly, the present invention can provide an apparatus for synthesizing spherical diamond powders by using the substrate II.

Figure 4A:
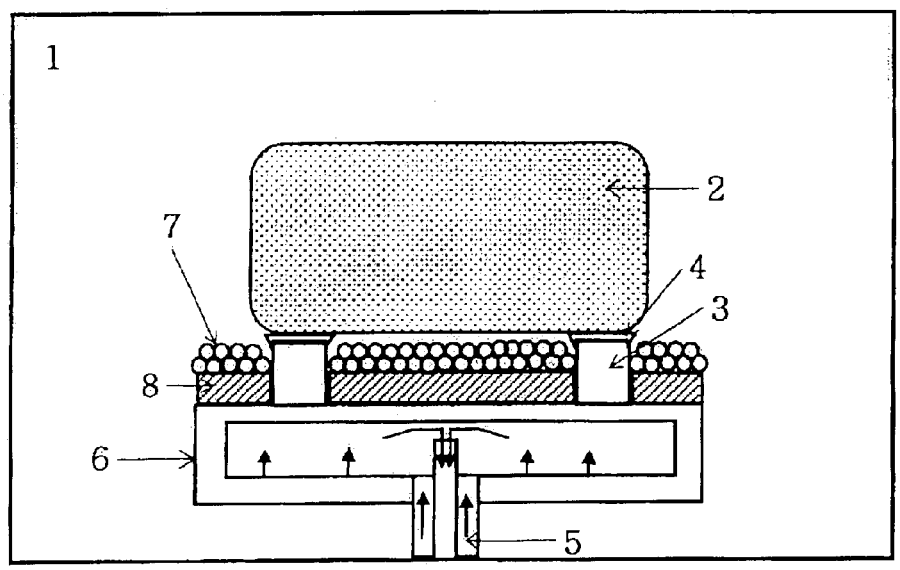
FIG. 4A is a schematic front view illustrating an apparatus for increasing the synthesis area of spherical diamond powder by using a ring-shaped substrate with plasma shown in FIGS. 1 and 2.
Figure 4B:
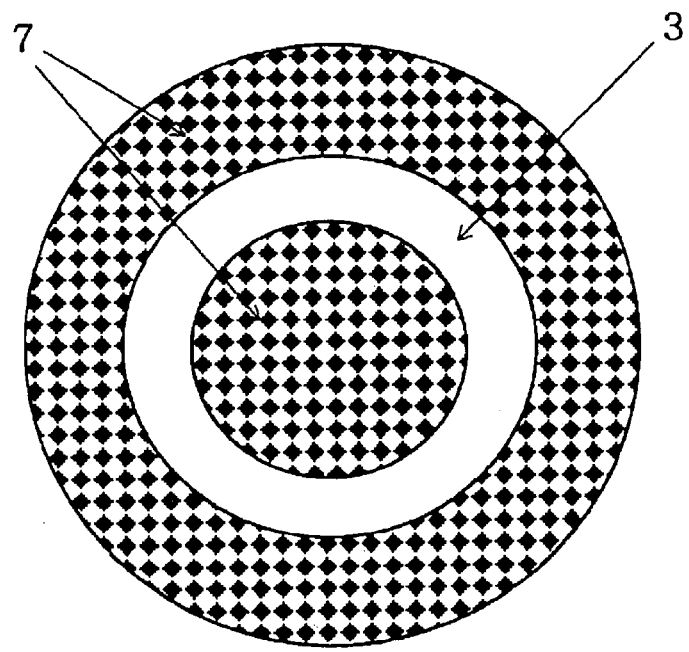
FIG. 4B is a schematic plane view illustrating the apparatus shown in FIG. 4A.

FIGS. 4A and 4B are a schematic front view and a schematic plane view of an apparatus to enlarge a deposition area of spherical diamond powders by a modification of the substrate structure of the apparatus in FIG. 2, respectively. In the apparatus, by arranging the substrate I (3) contacting the plasma 2 as a ring shape, a portion not contacting to plasma is formed not only outside but also inside of the ring-shaped substrate I (3), and accordingly an area not contacting the plasma is increased. And, the substrates II (8) are arranged at a portion inside and outside of the ring-shaped substrate I (3) contacting the plasma. When a deposition is performed with the apparatus, spherical diamond powders 7 can be obtained at not only the outside of the ring-shaped substrate I (3) but also the inside of the ring-shaped substrate I (3), and accordingly it is possible to synthesize spherical diamond powders in great quantities. Accordingly, the present invention provides an apparatus and a method for synthesizing spherical diamond powder by varying a shape of a substrate.

Figure 5A:
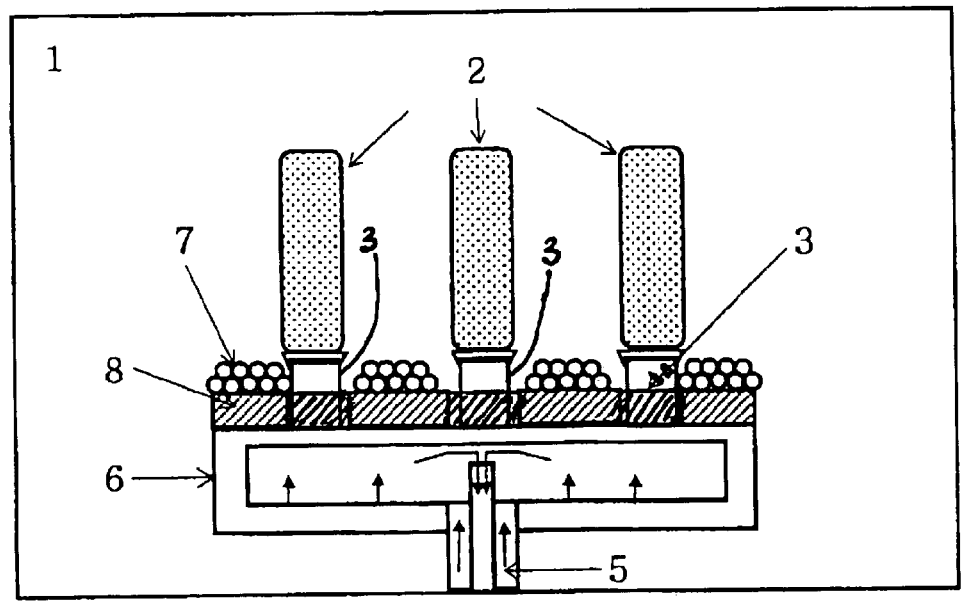
FIG. 5A is schematic front view illustrating apparatus for increasing the synthesis area of spherical diamond powder, using two or more substrates I.
Figure 5B:
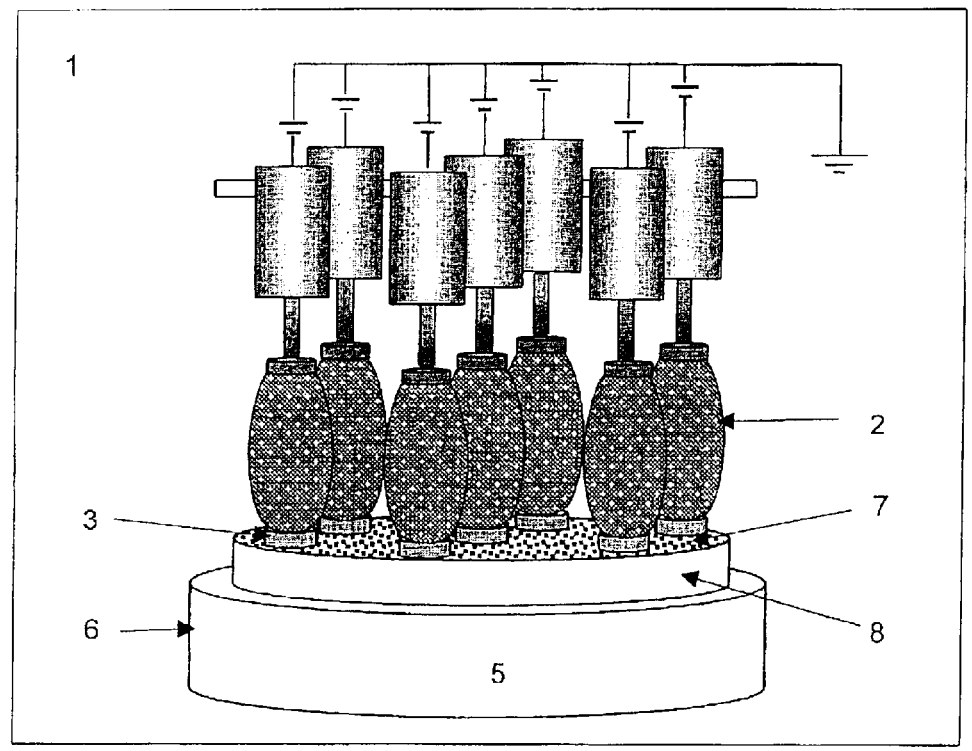
FIG. 5B is schematic front view illustrating apparatus for increasing the synthesis area of spherical diamond powder, in the multi-cathode direct current plasma assisted chemical vapor deposition (MCDC PACVD) apparatus using seven cathodes.
Figure 5C:
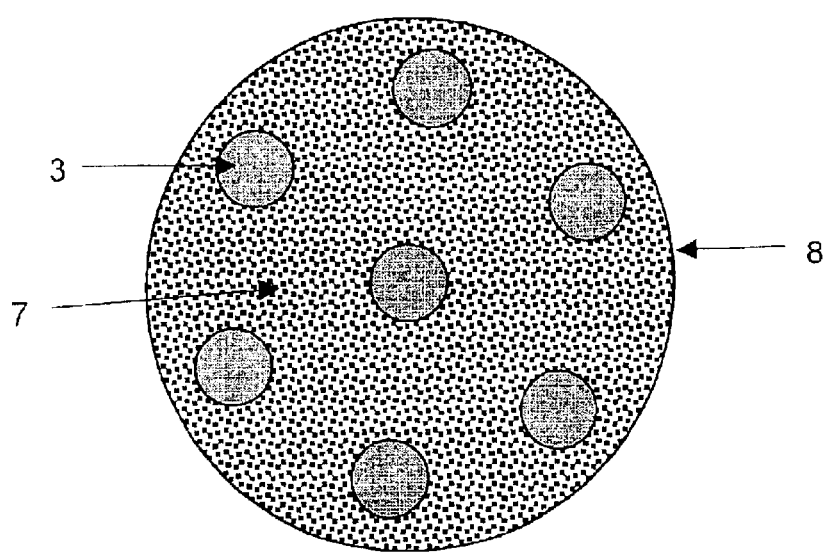
FIG. 5C is a schematic plane view illustrating the apparatus in FIG. 5A.

FIG. 5A is a schematic front view of an apparatus for synthesizing spherical diamond powders using two or more substrates I to enlarge a deposition area for diamond powders. Herein plasma is divided as many as the number of substrates I used and spherical diamond powders are synthesized on substrates II placed around substrates I. For example, FIGS. 5B and 5C are a schematic front view and a schematic plane view of the multi-cathode direct current plasma assisted chemical vapor deposition (MCDC PACVD) apparatus using seven-cathodes (U.S. patent application Ser. No. 09/563,482) to enlarge a deposition area of diamond powders. With a basic idea that using independent anodes can separate the plasma (2) and enlarge the boundary area of the plasma where diamond powders were obtained easily, seven molybdenum discs (3) with 15 mm diameter and 7 mm thickness to be served as a dummy anode on which plasmas are generated are placed just below each cathode on the copper substrate (8) for diamond powders to be obtained, as shown in FIGS. 5B and 5C. The copper substrate with a dimension of diameter 100 mm and thickness 10 mm is directly placed on the water-cooled anode and its temperatures was maintained below 749 K. In this apparatus, plasmas (2) are separately generated on each molybdenum disks (3) and accordingly the spherical diamond powders are synthesized on the substrate (8). As a result, the present invention provides an apparatus to enlarge a deposition area of the diamond powders and a method for synthesizing spherical diamond powders in nano size.

EXAMPLES

The present invention will be better understood from the below examples, but those examples are given only to illustrate the present invention, not to limit the scope of it.

Example 1

By using plasma generated in the multi-cathode DC PACVD (direct current plasma assisted chemical vapor deposition) apparatus, a ring-shaped substrate II made of copper and having an inner diameter as 80 mm, an outer diameter as 110 mm, a thickness as 5 mm was arranged around a Mo substrate I having a diameter as 76 mm and a thickness as 10 mm (with reference to FIG. 2), and then, a synthesis experiment was performed for 7 hours under synthesis conditions as 8% of methane composition 15 kW of power and 477° C. of a temperature of the ring-shaped substrate II. In the result, spherical diamond powders accumulated was synthesized onto the ring-shaped substrate II, as depicted in FIG. 3.

Example 2

Spherical diamond powder was synthesized in the same apparatus with Example 1 (with reference to FIG. 2) under the synthesis conditions as 8% of methane composition, 100 Torr of pressure and 200 sccm of a gas flow rate. Herein, spherical diamond as depicted in FIG. 3 was synthesized on the substrate II as shown in FIG. 2. The powders were accumulated and ranged between 0.5 μm and 2 μm in diameter and.

Example 3

By making an outer diameter of the substrate II as 30 cm in the same apparatus with Example 1 (with reference to FIG. 2), density distribution of diamond powder synthesized onto the substrate II was examined according to a distance from plasma. The synthesis conditions were the same with those of Example 1. A density of diamond powder synthesized at a portion separated from plasma as 1 cm onto the substrate II was almost same with that in FIG. 3. With going away from the plasma further, however, it was lowered and was almost '0' in a portion 10 cm away from the plasma. Accordingly, an effective distance from plasma capable of synthesizing diamond powder is within about 10 cm.

Example 4

In a different modified substrate structure (with reference to FIG. 5B), spherical diamond powders were formed also on the circumference of the molybdenum discs. The deposition was performed for 3 hours with the same condition indicated in Example 2. And as a result, diamond powders were obtained on the diameter 100 mm copper substrate II (8). The powders were confirmed to be diamond by XRD and TEM analysis. They are spherical ranging between 400 and 600 nm in diameter, and such a size distribution was maintained at all portion on the substrate. These results confirm that the boundary zone of the plasma prepared intentionally by the modified substrate structure provides an ideal-place for the diamond powders to be formed, and their deposition area can be effectively enlarged. Further increases of the deposition area will be possible by adding the number of cathodes in the MCDC PACVD system.

In the CVD synthesis method, the present invention provides an apparatus and a method for synthesizing spherical diamond powder having a diameter not greater than several $\mu$m and an apparatus and a method for synthesizing spherical diamond powder in great quantities by varying a structure of the apparatus. Such fine-grained diamond powder synthesized by the above-apparatus can be variously used for abrasive material in high quality-high speed grinding having a surface unevenness as several nm, electrode material of a FED (field emission display), diamond micro equipment fabrication and so on.

What is claimed is:

1. In a CVD (chemical vapor deposition) diamond synthesizing apparatus for synthesizing film-shape diamond on a substrate by decomposing carbon source reaction gas by forming a plasma in a vacuumed container, an apparatus for synthesizing spherical diamond powder, comprising:

a first substrate directly contacting with said plasma; and a second substrate possessing a height which is lower than the height of said first substrate, and on which second substrate said spherical diamond powder is synthesized being arranged to extend around the first substrate so as not to contact with said plasma;

wherein there are two or more first substrates in order to divide said plasma into two or more pieces, and the second substrate is arranged around the first substrate so as not to contact with said plasma.

2. The apparatus of claim 1, wherein the second substrate which is arranged so as not to contact with the plasma is placed at a distance within 10 cm from said plasma.

3. In a CVD (chemical vapor deposition) diamond synthesizing apparatus for synthesizing film-shaped diamond on a ring-shaped substrate by decomposing carbon source reaction gas by forming plasma in a vacuumed container, an apparatus for synthesizing spherical diamond powder, comprising:

a first substrate directly contacting with said plasma; and a second substrate possessing a height which is lower than the height of said first substrate, and on which second substrate said spherical diamond powder is synthesized, being arranged to extend around the first substrate so as not to contact with said plasma, said first substrate having a ring shape, and wherein the second substrate is arranged inside and outside of the ring-shaped first substrate so as not to contact with said plasma.

4. The apparatus of claim 3, wherein the second substrate which is arranged so as not to contact with the plasma is placed at a distance within 10 cm from said plasma.

5. In a multi-cathode direct current plasma-assisted chemical vapor deposition (MCDCPACD) diamond synthesizing apparatus for synthesizing film-shaped diamond on a substrate by decomposing carbon source reaction gas by forming a plasma in a vacuumed container, an apparatus for synthesizing spherical diamond powder, comprising:

a plurality of first substrate directly contacting with said plasma; and a second substrate possessing a height which is lower than the height of said first substrate, and on which second substrate said spherical diamond powder is synthesized being arranged to extend around the plurality of said first substrates so as not to contact with said plasma, said plurality of said first substrates corresponding with the number of said cathodes and being positioned on said second substrate, each of said first substrates being arranged closely below each of said cathodes so as to separate the plasma into portions corresponding to the number of said first substrates.

6. The apparatus of claim 5, wherein the second substrate which is arranged so as not to contact with the plasma is placed at a distance within 10 cm from said plasma.

* * * * *